United States Patent [19]

Mayama et al.

[11] Patent Number: 4,530,779

[45] Date of Patent: Jul. 23, 1985

[54] CONDUCTIVE SYNTHETIC RESIN MOLDING MATERIAL

[75] Inventors: Toshio Mayama, Kawaguchi; Hidehiro Iwase, Tokyo, both of Japan

[73] Assignee: Toshiba Chemical Products Co., Ltd., Tokyo, Japan

[21] Appl. No.: 540,563

[22] Filed: Oct. 11, 1983

[30] Foreign Application Priority Data

Jul. 11, 1983 [JP] Japan .................................. 58-124734
Jul. 11, 1983 [JP] Japan .................................. 58-124735

[51] Int. Cl.$^3$ .............................................. C08K 7/04
[52] U.S. Cl. .................................. 252/507; 252/511; 252/513; 264/104; 264/105; 264/145; 264/149; 264/174
[58] Field of Search ............... 264/104, 105, 145, 149, 264/174; 252/506, 511, 512, 513, 507

[56] References Cited

U.S. PATENT DOCUMENTS

| 3,708,387 | 1/1973 | Turner | 252/512 |
| 3,983,195 | 9/1976 | Arons | 264/174 |
| 4,367,745 | 1/1983 | Welage | 252/511 |
| 4,438,059 | 3/1984 | Mollman | 264/105 |

Primary Examiner—Paul R. Michl
Attorney, Agent, or Firm—Oblon, Fisher, Spivak, McClelland & Maier

[57] ABSTRACT

A conductive synthetic resin composition, which is suited for manufacturing a molded product having an excellent electromagnetic shielding effect, and comprises master pellets consisting of a cylindrical synthetic resin layer and a bundle of a number of strands of fibrous conductive filler filled inside said synthetic resin layer in a longitudinal direction thereof, the master pellets being cut in the form of pellets; and natural pellets consisting of a synthetic resin.

15 Claims, 4 Drawing Figures

CONDUCTIVE SYNTHETIC RESIN MOLDING MATERIAL

BACKGROUND OF THE INVENTION (1) Field of the Invention

The present invention relates to a conductive synthetic resin molding material which, upon being molded, causes only a slight degradation in the mechanical strength of the synthetic resin, and which has an excellent electromagnetic shielding effect.

(2) Description of the Prior Art

To protect electronic circuits from external disturbance and to prevent the undesired leakage of electromagnetic waves from an oscillation circuit or the like, the casing of such electronic equipment must be made of an electromagnetic shielding material. The electromagnetic shielding material may be a metal, a conductive synthetic resin or the like. Although the former has an excellent electromagnetic shielding effect, it is disadvantageous, in that it is heavy, expensive and has poor workability. For this reason, the latter, a conductive synthetic resin, is currently in widest use.

One method of rendering a synthetic resin electrically conductive includes the technique of forming a conductive layer on the surface of a synthetic molded product, either by application of a conductive paint or by spraying or plating a metal onto the synthetic resin product, as well as the internal addition technique of adding a conductive filler such as carbon, a metal powder or a fiber to the synthetic resin material itself. The former method requires a large number of steps and does not allow for easy mass-production. Furthermore, the conductive layer formed by this method may eventually peel after a long period of time. For this reason, the latter method is expected to be more practical. Despite its advantages, however, the latter method is also subject to the following problems. First, to obtain a desired electromagnetic shielding effect, a large amount of a conductive filler, such as carbon or a metal, must be mixed with the resin. This frequently results in poor dispersion of the filler or a low mechanical strength of the final product. Furthermore, when a metal or the like is added to the resin, the synthetic resin is degraded in its various properties. In addition to this, a metal fiber or a fibrous filler with good flexibility tends to become entangled in its initial form in a single substance. Thus, such a filler must be disentangled before addition to the resin. Uniform milling of the resin, together with such a filler, requires advanced skill and technology, due to differences in specific gravity and shape. An operator may also suffer from pain or itchiness in handling the fiber, which presents a problem in the working environment.

SUMMARY OF THE INVENTION

One object of the present invention is to provide a conductive synthetic resin material which is free from such problems in the working environment, which allows for the uniform dispersion of a conductive filler in a synthetic resin, which minimizes degradation of the mechanical strength of a plastic molded product upon the addition thereof, and which has an excellent electromagnetic shielding effect.

To achieve the above object according to the present invention, a conductive synthetic resin molding material is provided, which comprises: master pellets consisting of a cylindrical synthetic resin layer and a bundle of a number of strands of fibrous conductive filler filled inside said synthetic resin layer in a longitudinal direction thereof, the master pellets being cut in the form of pellets; and natural pellets consisting of a synthetic resin.

DETAILED DESCRIPTION OF THE PREFERRED EMBODIMENTS

The preferred embodiment of the present invention may now be described with reference to the accompanying drawings.

Figure 1:
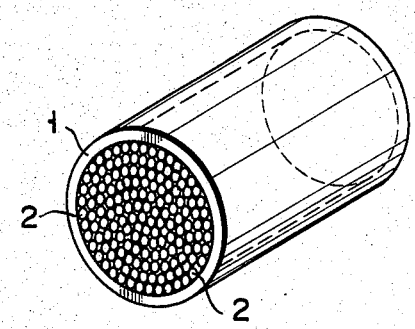
FIG. 1 is a perspective view of a master pellet according to the present invention.

FIG. 1 shows a fibrous conductive filler coated with a synthetic resin (i.e., a master pellet) according to the present invention. The master pellet comprises a cylindrical synthetic resin layer 1 and a bundle of a number of strands of fibrous conductive filler 2 filled within the layer 1 along the longitudinal direction thereof.

The fibrous conductive filler 2 may be a fiber of a metal having a high electromagnetic shielding effect, such as copper, iron, nickel, aluminum or an alloy thereof; carbon fiber; other electroconductive inorganic fibers; an inorganic fiber, such as glass fiber or corbon fiber, coated with an electroconductive layer such as a metal layer. The fiber preferably has a small diameter and is generally used in a bundle of from 100 to 50,000 fiber strands.

The cylindrical synthetic resin layer 1 may consist of a thermoplastic resin such as a polystyrene resin, an ABS resin, a polycarbonate resin, or a modified PPO resin.

The pellets of the fibrous conductive filler of the present invention are used after being admixed with general synthetic resin pellets (to be referred to as natural pellets, hereinafter). The synthetic resin of the synthetic resin layer 1 may be the same synthetic resin as that of the natural pellets, a resin which provides a reinforcing effect in synergism with the natural pellet resin, or a resin which forms a blend polymer with the natural pellet resin. For example, if it is desired to obtain a molded product of a styrene-type polymer, good results are obtained with a modified PPO resin, a polybutadiene resin, a polycarbonate resin or the like.

To improve dispersion and adhesion within the resin of an objective plastic molded product and to prevent degradation of the mechanical strength of the plastic molded product, the fibrous conductive filler of the present invention may be formed by coating a titanate coupling agent onto the surface of a fibrous conductive filler bundle and, then, by convering the surface of the coupling layer with a synthetic resin layer.

Figure 2:
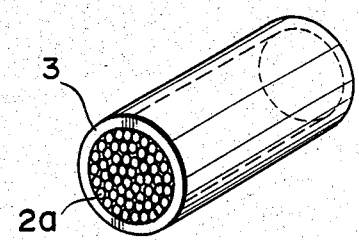
FIG. 2 is a perspective view of a bundle of a conductive filler coated by a titanate coupling layer used in the present invention.
Figure 3:
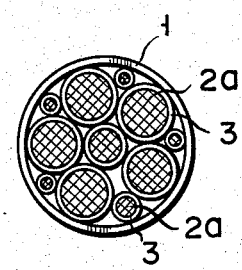
FIG. 3 is a sectional view of a master pellet in which a bundle of a large number of the bundles of conductive filler shown in FIG. 2 is further coated with a synthetic resin layer.

FIGS. 2 and 3 show an example of such a filler. As shown in FIG. 2, a titanate coupling layer 3 is formed on the outer surface of a bundle 2a of fibrous conductive filler strands and a synthetic resin layer 1 is formed therearound. A bigger bundle of such filler bundles may be formed, and a synthetic resin layer 1 may be formed to surround its outer circumferential surface, as shown in FIG. 3. In this case, the number of fiber strands of the filler in each bundle 2a is not particularly limited, provided only that the total number of fibrous conductive filler strands included in the synthetic resin layer 1 is within the range of 100 to 50,000.

In the above embodiments shown in FIGS. 1 and 3, cylindrical master pellets of circular cross-sectional shape have been illustrated, but cylindrical master pellets of other cross section such as squeezed or flattened shape (For example 6 mm length×4~5 mm width×1~2 mm thickness) may also be useful. These flattened master pellets can be more easily dispersed within natural pellet than those of circular cross section during feeding step into a hopper or molding step.

Examples of titanate coupling agent useful for forming the titanate coupling layer 3 of the present invention may include isopropyltridodecylbenzene sulfonyl titanate, isopropyltris(dioctylpyrophosphate) titanate, bis(dioctylpyrophosphate) oxyacetate titanate, bis(dioctylpyrophosphate) ethylene titanate, isopropyltri(dioctylphosphate) titanate, isopropyltricumylphenyl titanate, isopropyltri(N-aminoethyl aminoethyl) titanate, or mixtures thereof. Table 1 (below) shows the chemical formulas of these coupling agents.

TABLE 1

| Chemical Name | Structural Formula |
| --- | --- |
| Bis(dioctylpyrophosphate) Oxyacetate Titanate | |
| Bis(dioctylpyrophosphate) Ethylene Titanate | |
| Isopropyltridodecylbenzene Sulfonyl Titanate | |
| Isopropyltris(dioctylpyrophosphate) Titanate | |
| Isopropyltri(dioctylphosphate) Titanate | |
| Isopropyltricumylphenyl Titanate | |
| Isopropyltri(N—aminoethyl-aminoethyl) Titanate | $CH_3-CH(CH_3)-O-Ti[-O-C_2H_4-NH-C_2H_4-NH_2]_3$ |

The pellets (master pellets) of the fibrous conductive filler of the present invention are generally mixed with the natural pellets in a mixing ratio in the range of from 1:1 to 1:20, based on weight.

Figure 4:
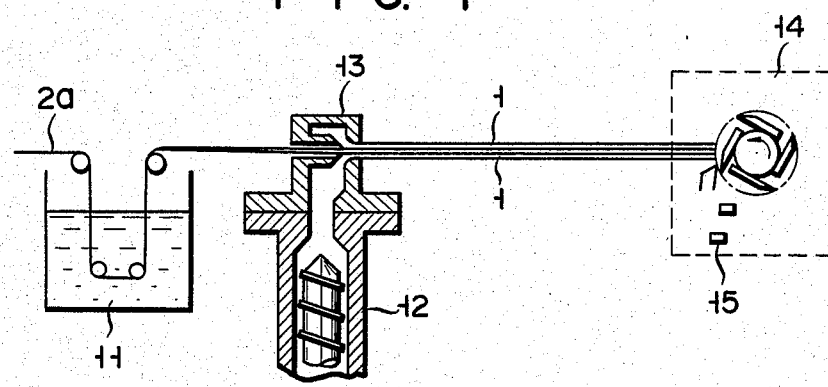
FIG. 4 is a representation showing an example of the manufacture of the pellets of conductive filler according to the present invention.

A method for manufacturing a molding material in which the master pellets are covered with a titanate coupling layer may now be described with reference to FIG. 4. One or more bundles 2a of a long fibrous conductive filler 2 are passed through a titanate coupling agent solution 11 for surface treatment. The bundle is passed through a die 13 of an extruder 12 for extruding a synthetic resin layer 1 therearound. The bundle is then cut to proper lengths by a cutting device 14 to provide master pellets 15. The master pellets 15 can be continuously obtained by this process. If the coupling layer is not required, the master pellets 15 may be obtained by omitting the step of passing the conductive filler 2 through the titanate coupling agent solution, in the process shown in FIG. 4. Flattened master pellets may be obtained by positioning a pair of press rollers between the extruder 12 and the cutting device 14.

The conductive synthetic resin molding material of the present invention may comprise natural pellets or a mixture thereof with another suitable material. Since the conductive synthetic resin molding material of the present invention has the configuration described above, it is easy to handle, presents no problems in the working environment, and provides an excellent dispersion of the filler in the resin. The molding material of the present invention thus allows for the molding of a product which has an excellent electromagnetic shielding effect and which sustains no degradation of its mechanical strength. Since the step of milling the conductive filler with the resin in a conventional method is eliminated, the number of steps is decreased.

EXAMPLE 1

Three hundred elongated copper fiber strands, each having a diameter of about 50 μm, were bundled together. The bundle was coated with a thin polystyrene resin layer to have a diameter of about 2 mm. The bundle was cut into lengths of 5 mm to provide master pellets. Natural pellets of a polystyrene resin were mechanically mixed in an amount of 3 parts by volume with 1 part by volume of these master pellets to provide a conductive molding material. The obtained molding material was used for injection molding of a plate having a thickness of 3 mm. The molded plate had an electromagnetic shielding effect of 40 dB at 500 MHz. The conductive filler was uniformly dispersed within the molded plate and the plate did not sustain any decrease in mechanical strength, nor any degradation in other properties.

COMPARATIVE EXAMPLE 1

Four parts by volume of a polystyrene resin were mechanically mixed with one part by volume of a copper fiber having a diameter of about 50 μm and a length of 5 mm, to provide a conductive molding material. A plate was molded following the same procedures as those in Example 1. The obtained plate had an electromagnetic shielding effect of 20 dB at 500 MHz. The conductive filler was irregularly distributed in the plate, and the plate suffered a decrease in mechanical strength.

EXAMPLES 2 AND 3

In accordance with the composition shown in Table 2 below, 300 strands of an elongated copper fiber having a diameter of about 50 μm were bundled together. After pickling and drying, the bundle was passed through a titanate coupling agent solution to perform surface treatment of the copper fiber. A polystyrene resin layer was extrusion coated on the thus obtained conductive filler having a titanate coupling layer until the bundle had a diameter of about 2 mm. The bundle was then cut into lengths of 5 mm to provide master pellets. Two parts by volume of natural pellets of a polystyrene resin were mechanically mixed with one part by volume of the master pellets to manufacture a conductive molding material. The molding material was injection molded to obtain a molded product. The product was subjected to tests of its mechanical and electrical properties. The results obtained are shown in Table 2 below.

CONTROLS 1 AND 2

A conductive molding material was prepared following the same procedures as those in Examples 2 and 3 above. Molded products were obtained following the same procedures as in Examples 2 and 3, except that coupling was not performed in Control 1 and a silane coupling agent was used in Control 2. The products obtained were subjected to the same tests of mechanical and electrical properties as those conducted in Examples 2 and 3. The results obtained are also shown in Table 2.

TABLE 2

| | Example | | Control | |
|---|---|---|---|---|
| | 2 | 3 | 1 | 2 |
| Composition | | | | |
| Synthetic Resin Polystyrene (parts) | 70 | 70 | 70 | 70 |
| Conductive Filler Copper Fiber (parts) | 30 | 30 | 30 | 30 |
| Titanate Coupling Layer | | | | |
| Isopropyltris(dioctylpyrophosphate) Titanate | o | — | — | — |
| Isopropyltridodecyl-Benzene Sulfonyl Titanate | — | o | — | — |
| Mercaptopropyltri-Methoxysilane | — | — | — | o |
| Molding Material | | | | |
| Master Pellet (parts by volume) | 1 | 1 | 1 | 1 |
| Natural Pellet (parts by volume) | 2 | 2 | 2 | 2 |
| Mechanical Property | | | | |
| Tensile Strength (kg/cm$^2$) | 350 | 300 | 280 | 360 |
| Bend Strength (kg/cm$^2$) | 600 | 540 | 510 | 620 |

TABLE 2-continued

| | Example | | Control | |
|---|---|---|---|---|
| | 2 | 3 | 1 | 2 |
| Impact Strength (kg · cm/cm) | 9.2 | 8.0 | 7.9 | 9.8 |
| Electrical Property Volume Resistivity at 65° C. (Ω · cm) | | | | |
| 0 h | $3 \times 10^{-3}$ | $3 \times 10^{-3}$ | $3 \times 10^{-3}$ | $3 \times 10$ |
| 100 h | $7 \times 10^{-3}$ | $4 \times 10^{-3}$ | $2 \times 10^{-1}$ | $2 \times 10^3$ |
| Shielding Effect at 500 MHz (dB) | 50 | 50 | 50 | 15 |

What is claimed is:

1. A conductive synthetic resin molding material comprising: master pellets consisting of a cylindrical synthetic resin layer and a bundle of a number of strands of fibrous conductive filler filled inside said synthetic resin layer in a longitudinal direction thereof, the master pellets being cut in the form of pellets; and natural pellets consisting of a synthetic resin.

2. A molding material according to claim 1, wherein the conductive filler is a metal fiber.

3. A molding material according to claim 1, wherein the conductive filler is a carbon fiber or carbon fiber coated with a metal layer.

4. A molding material according to claim 1, wherein the conductive filler is a glass fiber coated with a metal layer.

5. A molding material according to claim 1, wherein the conductive filler is coated with a metal.

6. A molding material according to claim 1, wherein a bundle of the conductive filler has a coating layer of a titanate coupling agent on a surface thereof.

7. A molding material according to claim 6, wherein the coating layer of the titanate coupling agent consists of a member selected from the group consisting of isopropyltridodecylbenzene sulfonyl titanate, isopropyltris(dioctylpyrophosphate) titanate, bis(dioctylpyrophosphate) oxyacetate titanate, bis(dioctylpyrophosphate) ethylene titanate, isopropyltricumylphenyl titanate, isoprophl(N-aminoethyl-aminoethyl) titanate, and isopropyltri(dioctylphosphate) titanate.

8. A molding material according to claim 6, wherein the bundle of the conductive filler consists of a plurality of smaller bundles.

9. A molding material according to claim 1, wherein the mixing ratio of the master pellets to the natural pellets is in the range of from 1:1 to 1:20, based on weight.

10. A molding material according to claim 1, wherein a resin of the cylindrical synthetic resin layer and the synthetic resin of the natural pellets are of the same type.

11. A molding material according to claim 1, wherein a resin of the cylindrical synthetic resin layer and the synthetic resin of the natural pellets produce a polymer blend.

12. A molding material according to claim 1, wherein the master pellets are shaped flat.

13. A method of continuously forming master pellets, which comprises the steps of continueously passing a bundle of fibrous conductive fillers through an extruder for coating a synthetic resin layer around the bundle and cutting the bundle coated with the resin.

14. A method according to claim 13, wherein said bundle is precoated with a titanate coupling agent before being passed through the extruder.

15. A method according to claim 13, wherein a step of pressing the bundle coated with the resin is included after the step of passing the bundle through the extruder and before the step of cutting the bundle coated with the resin.

* * * * *